(12) United States Patent
Bar et al.

(10) Patent No.: US 10,432,194 B2
(45) Date of Patent: Oct. 1, 2019

(54) ADAPTIVE SIGNAL THRESHOLD FOR TRIGGERING KICK DETECTION

(71) Applicant: IEE International Electronics & Engineering S.A., Echternach (LU)

(72) Inventors: Johann Bar, Haute-Sierck (FR); Baptiste Anti, Hettange-Grande (FR); Hans Peter Beise, Perl (DE); Thomas Stifter, Trier (DE)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 15/753,794

(22) PCT Filed: Aug. 18, 2016

(86) PCT No.: PCT/EP2016/069639
§ 371 (c)(1),
(2) Date: Feb. 20, 2018

(87) PCT Pub. No.: WO2017/032693
PCT Pub. Date: Mar. 2, 2017

(65) Prior Publication Data
US 2018/0248545 A1    Aug. 30, 2018

(30) Foreign Application Priority Data

Aug. 24, 2015 (LU) .......................................... 92 805
Dec. 24, 2015 (LU) .......................................... 92 933

(51) Int. Cl.
| | | |
|---|---|---|
| E05F 15/73 | (2015.01) | |
| H03K 17/945 | (2006.01) | |
| G01D 5/24 | (2006.01) | |

(52) U.S. Cl.
CPC ........... *H03K 17/945* (2013.01); *E05F 15/73* (2015.01); *G01D 5/24* (2013.01); *E05Y 2400/32* (2013.01);
(Continued)

(58) Field of Classification Search
CPC ..... B60Q 5/005; B60R 25/00; B60R 25/2036; B60R 25/2045; B60R 25/2054;
(Continued)

(56) References Cited

U.S. PATENT DOCUMENTS 8,284,022 B2   10/2012   Kachouh
9,637,049 B2    5/2017   Russ et al.
(Continued)

FOREIGN PATENT DOCUMENTS

DE   202005020140 U1   5/2007
WO   WO2012084111 A1   6/2012

OTHER PUBLICATIONS

International Search Report for International application No. PCT/EP2016/069639, dated Nov. 7, 2016, 3 pages.
(Continued)

*Primary Examiner* — Charles J Han
(74) *Attorney, Agent, or Firm* — Reising Ethington P.C.

(57) ABSTRACT

A method of operating a sensor system having at least one proximity sensor, with regard to generating a trigger signal indicative of an occurrence of an operator-intended event in the presence of noise. The method includes repetitive steps of: acquiring the sensor signal at specified sampling times, comparing a value obtained as a presently sampled sensor signal with a presently valid first threshold value, generating a trigger signal if the value obtained as the presently sampled sensor signal is as large as or exceeds the presently valid first threshold value, omitting to generate a trigger signal if the value obtained as the presently sampled sensor signal is less
(Continued)

than or equal to the presently valid first threshold value, forming a subset out of the sampled sensor signals, determining an update value for the first threshold value, and replacing the presently valid first threshold value by the update value.

10 Claims, 5 Drawing Sheets

(52) U.S. Cl.
CPC ..... *E05Y 2400/44* (2013.01); *E05Y 2400/858* (2013.01); *E05Y 2900/546* (2013.01); *H03K 2217/94026* (2013.01); *H03K 2217/94031* (2013.01)

(58) Field of Classification Search
CPC .......... B60R 25/24; E05F 15/00; E05F 15/73; E05F 15/76; E05Y 2400/852; E05Y 2400/858; E05Y 2400/86; E05Y 2900/546
See application file for complete search history.

(56) References Cited

U.S. PATENT DOCUMENTS

| 2011/0156800 | A1  | 6/2011  | Lee et al. |
| 2014/0131551 | A1* | 5/2014  | Lin ....................... G01S 17/026 250/206.1 |
| 2014/0324273 | A1* | 10/2014 | Russ ....................... B60R 25/00 701/29.1 |
| 2016/0116343 | A1* | 4/2016  | Dixon ....................... G01J 1/44 250/342 |

OTHER PUBLICATIONS

Written Opinion for International application No. PCT/EP2016/069639, dated Nov. 7, 2016, 5 pages.

\* cited by examiner

ADAPTIVE SIGNAL THRESHOLD FOR TRIGGERING KICK DETECTION

TECHNICAL FIELD

The invention relates to method of operating a sensor system with regard to generating a trigger signal indicative of an occurrence of an event in the presence of noise, a control unit for a system for generating a trigger signal for the activation of a motor-driven vehicle door member using such method, and a software module for carrying out the method.

BACKGROUND ART

Sensor-controlled automatic actuation of motorized tailgates of motor vehicles is known in the art.

Utility model document DE 20 2005 020 140 U1 describes a motor vehicle door arrangement with at least one motor vehicle door and a drive for motorized movement of the motor vehicle door from the closed position into the open position and from the open position into the closed position. The arrangement further comprises a control for triggering the drive, the control being assigned an optionally actuatable mobile part which the user generally carries and which interacts with the control means over a wireless transmission link when the user approaches the motor vehicle, enhanced activation automatically carrying out opening and/or a closing as triggered by a predetermined process of use and without the necessity of activating the mobile part. In one embodiment, provision is made for a user-side operator control event, namely a user-side foot movement, to cause the motorized opening of the tailgate. With respect to enhanced activation, the control means, especially with the vehicle stopped, can be moved into the activated and deactivated states, and can be triggered by the predetermined usage process exclusively when the control means is in the activated state.

Further, international application WO 2012/084111 A1 describes a closure element assembly of a motor vehicle having a motor-displaceable closure element, wherein a sensor assembly and a sensor controller are provided for generating an operating message. By means of the operating message, motor displacement of the closure element can be triggered. The sensor controller monitors the sensor-measured values during operating event monitoring. During fault situation monitoring, the sensor controller monitors the sensor-measured values for the occurrence of a behavior that is characteristic of a fault situation.

During the fault situation monitoring process, the sensor controller increments a "fault indicator" variable if an indication of a fault is registered at the monitoring time and, when a predetermined threshold value for the fault indicator is exceeded, a fault situation is registered as true in the sensor controller. The sensor controller generates an operating message only when, according to the two monitoring actions, an operating event but no fault situation is present.

An operational reliability of the above-presented prior art application crucially depends on an ability of the employed method for detecting an occurrence of an operator-intended event in surroundings comprising noise, for instance from interfering objects, whose magnitude may suffice to reach any predetermined threshold value set for triggering.

In the above-described systems of the prior art, when a foot or leg approaches a sensor, a sensor-generated signal is increasing. When a specified threshold is crossed, the system performs advanced measurements to validate/invalidate the foot movement.

Defining a low fixed specified threshold value, in order to start advanced measurements as soon as possible to react quickly to an event, is not viable if the signal noise is too high. The specified threshold would be crossed too often, and this would result in excessive power consumption.

Conversely, defining a high fixed specified threshold value in order to be protected against noise could result in a poor system performance, as the reaction to the event would occur in a delayed way.

SUMMARY AND OBJECTS OF THE INVENTION

It is therefore desirable to have a method of operating a sensor system with regard to generating a trigger signal indicative of an occurrence of an operator-intended event with an improved performance regarding detection of operator-intended events in the presence of noise, sensor system power consumption and fast response to operator-intended events.

In one aspect of the present invention, this object is achieved by a method of operating a sensor system, wherein the sensor system comprises at least one sensor that generates a sensor signal indicative of a sensed physical quantity, with regard to generating a trigger signal indicative of an occurrence of an event in the presence of noise. The method comprises repetitive steps of acquiring the sensor signal at specified sampling times, comparing a value obtained as a presently sampled sensor signal with a presently valid first threshold value, generating a trigger signal if the value obtained as the presently sampled sensor signal is as large as or exceeds the presently valid first threshold value, omitting to generate a trigger signal if the value obtained as the presently sampled sensor signal is less than the presently valid first threshold value, forming a subset out of the sampled sensor signals, wherein a predetermined number of consecutively acquired sensor signals immediately preceding the presently sampled sensor signal is excluded from forming the subset, based on the formed subset of sampled sensor signals, determining an update value for the first threshold value, replacing the presently valid first threshold value by the update value for the first threshold value as a new presently valid first threshold value.

One advantage of the method lies in that false trigger due to time dependent noise are reliably prevented as the updated threshold value prevents generating a trigger signal in the presence of time-dependent noise. It will be noted that the method is an adaptive method, which means that that the first threshold value may be increased in a high noise environment or may be lowered in a low noise environment. The method thus adapts the sensitivity to the corresponding environment and thus ensures reliable detection of a trigger event.

The noise may be caused by changes in the surroundings with regard to the physical quantity to which the at least one sensor is sensitive. The noise may also have its origin in electromagnetic interference (EMI).

Another advantage lies in that at the same time, a trigger signal can be generated in fast response to an occurrence of a true event in a high-performance manner.

The exclusion of the predetermined number of consecutively acquired sensor signals immediately preceding the presently sampled sensor signal from the step of forming the subset can prevent replacing the presently valid first threshold value too quickly by a larger (or smaller) new presently valid first threshold value in case of sudden increase of the sensor signal, in which case a trigger signal might not be generated.

The specified sampling times may be based on a priori knowledge about a frequency range of the event to be sensed and the present noise to be expected. According to the Nyquist-Shannon sampling theorem, frequencies lower than or equal to half of a sampling frequency are perfectly reconstructible. In one embodiment, the predetermined number of consecutively acquired sensor signals to be excluded may be selected to comprise at least three periods, more preferable at least five periods, and, most preferable, at least ten periods of the highest perfectly reconstructible frequency.

Preferably, the specified sampling times are kept constant while carrying out the method. However, adjusting the specified sampling time dependent on a magnitude of the sensor signal is also contemplated. For instance, the specified sampling time could be step-wise reduced if the magnitude of the sensor signal crosses another predetermined threshold value.

If the step of acquiring the sensor signal at specified sampling times comprises digitally converting the acquired sensor signal, the benefits of well-known methods of digital signal processing apply to the subsequent steps of the method.

In a preferred embodiment of the method, the step of determining an update value for the first threshold value comprises calculating a statistical measure that is indicative of a volatility of the values of at least the formed subset of sampled sensor signals. The step of determining an update value for the first threshold value is based on the calculated statistical measure.

Examples for the statistical measure include, but are not limited to, standard deviation, variance and mean absolute deviation. Also a weighted statistical measure is contemplated, for instance a weighting based on a magnitude and/or a frequency of the sensor signal.

In this way, the noise present in the sensor signal can be considered as a whole for reliably preventing generating a false trigger due to time dependent noise.

In another preferred embodiment of the method, the step of determining an update value for the first threshold value comprises
   multiplying the calculated statistical measure by a predetermined constant factor,
   comparing the calculated product with a predetermined lower bound value, and
   determining an update value for the first threshold value as the maximum of the calculated product and the predetermined lower bound value.

In this way, a predetermined distance between the sensor signal comprising the wanted signal superposed by noise and the update value for the first threshold value can be kept to prevent generating a trigger signal by the noise present, meaning a false alarm.

In yet another preferred embodiment of the method, the step of determining an update value for the first threshold value comprises
   calculating a difference of the presently valid first threshold value and the presently sampled sensor signal,
   comparing the calculated difference with a predetermined distance value,
   calculating the update value for the first threshold value as the sum of the presently sampled sensor signal and the predetermined distance value, if the calculated difference is less than the predetermined distance value,
   calculating the update value for the first threshold value as the sum of a maximum taken among a predetermined number of samples acquired before the presently sampled sensor signal and the predetermined distance value, if the calculated difference is larger than the predetermined distance value.

Also in this way, a predetermined distance between the sensor signal comprising the wanted signal superposed by noise and the update value for the first threshold value can be kept to prevent generating a trigger signal by the noise present, i.e. a false alarm can advantageously and reliably be avoided.

In a variation of this preferred embodiment of the method having similar benefits, the step of determining an update value for the first threshold value further comprises
   comparing the calculated update value for the first threshold value with a predetermined lower bound value, and
   determining an update value for the first threshold value as the maximum of the calculated update value and the predetermined lower bound value.

In another preferred embodiment of the method, the step of determining an update value for the first threshold value comprises
   calculating a plurality of coefficients with respect to a suitable set of decomposition vectors, for instance orthonormal vectors as they are for example used in the discrete Fourier transform, for at least the formed subset out of the sampled sensor signals,
   determining a highest absolute value among the calculated plurality of coefficients,
   determining the update value for the first threshold value as the lesser of the determined highest absolute value and a second predetermined lower bound value.

As discussed before, frequencies lower than or equal to half of the sampling frequency are perfectly reconstructible and a plurality of discrete coefficients exists up to this frequency. The plurality of coefficients with respect to a suitable set of decomposition vectors may for instance comprise orthonormal vectors as they are for example used in the discrete Fourier transform, i.e. a plurality of discrete Fourier coefficients, or wavelet coefficients or the like.

In this way, a predetermined distance between the sensor signal comprising the wanted signal superposed by noise and the update value for the first threshold value can be kept to prevent generating a trigger signal by the noise present, meaning a false alarm. This embodiment of the method is especially suitable for applying a weighting with regard to a frequency of the noise.

In another preferred embodiment of the method, the at least one sensor of the sensor system is designed as a proximity sensor, the event is formed by an operator-intended event, and the trigger signal is designed as an input to a control unit for controlling an activation of a motor-driven vehicle door member.

In this way, the benefits of the disclosed methods presented before, in particular with regard to improved performance regarding distinction of operator-intended events and noise, in particular by interfering objects and a fast response to operate-intended events apply to the method for controlling an activation of the motor-driven vehicle door member.

Preferably, the at least one proximity sensor is based on a capacitive operating principle.

In yet another preferred embodiment, the method further comprises steps of comparing the determined update value for the first threshold value with a predetermined second threshold value, and omitting to generate a trigger signal if the determined update value for the first threshold value is equal to or larger than the predetermined second threshold value.

In this way, any indication of an occurrence of an event is blocked, as a detected level of noise, for instance from electromagnetic interference or from interference with the at least one sensor and other physical objects than the operator, reached or exceeded a level that is beyond a regime for reliable operation. The predetermined second threshold value is selected appropriately, based on results of calibration measurements.

It is another object of the invention to provide a control unit for a system for generating a trigger signal for the activation of a motor-driven vehicle door member. The control unit comprises at least one processor unit and at least one digital data memory unit, wherein the at least one processor unit has data access to the at least one digital data memory unit, a sensor driving unit that is electrically connectable to at least one proximity sensor that is configured to generate a sensor signal indicative of a distance to an object, for providing a driving voltage to the at least one proximity sensor, and a sensor signal evaluation unit that is connectable to the at least one proximity sensor and is configured for receiving the sensor signal as a signal input, and is further configured for evaluating the received sensor signal by carrying out steps of an embodiment of the method as disclosed herein.

Moreover, the at least one processor unit is configured, upon and as long as receiving a trigger signal from the sensor signal evaluation unit, to carry out additional steps of detailed evaluation of the sensor signal for generating an output signal for at least initiating an activation of the motor-driven vehicle door member, based on predetermined sensor signal validation criteria.

In this way, the benefits presented before with regard to the method of operating a sensor system apply to the control unit for generating a trigger signal for the activation of the motor-driven vehicle door member. Furthermore, a level of power consumption of the control unit can be reduced by avoiding unintendedly carrying out the additional steps of detailed evaluation of the sensor signal.

In a further aspect of the invention, a software module is provided for carrying out an embodiment of the method disclosed herein, wherein the method steps to be conducted are converted into a program code of the software module that is implementable in a digital data memory unit and that is executable by a processor unit. The processor unit may preferably be the processor unit of the control unit for controlling activation of a motor-driven vehicle door member.

The software module can enable a robust and reliable execution of the method and can allow for a fast modification of method steps.

These and other aspects of the invention will be apparent from and elucidated with reference to the embodiments described hereinafter.

BRIEF DESCRIPTION OF THE DRAWINGS

Preferred embodiments of the invention will now be described, by way of example, with reference to the accompanying drawings, in which.

DESCRIPTION OF PREFERRED EMBODIMENTS

Figure 1:
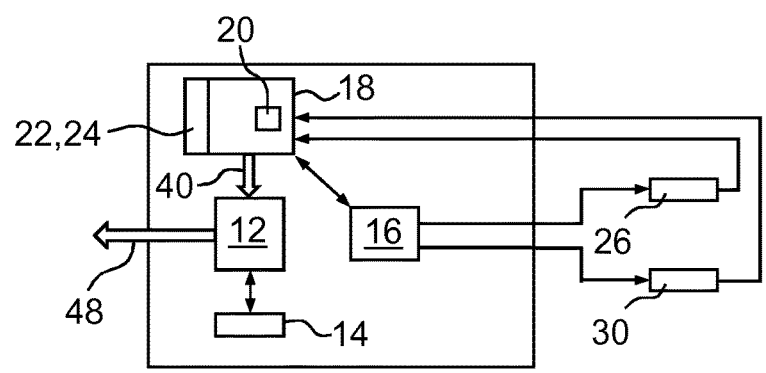
FIG. 1 is a schematic illustration of a control unit in accordance with the invention.

FIG. 1 schematically illustrates a control unit 10 for generating a trigger signal for controlling activation of a motor-driven vehicle door member in accordance with an embodiment of the invention. The vehicle door member is e.g. formed by a tailgate. The control unit 10 includes a processor unit 12, and a sensor driving unit 16 that is electrically connected to two proximity sensors 26, 30 for providing driving voltages to the proximity sensors 26, 30. Each one of the two proximity sensors 26, 30 is designed as a capacitive sensor that is configured to generate a sensor signal 28, 32 indicative of a sensed physical quantity given by a distance to an object, in particular a foot of an operator, as will be described later on.

The control unit 10 further comprises a sensor signal evaluation unit 18 that is connected to the proximity sensors 26, 30 and is configured for receiving the sensor signals 28, 32 as signal inputs. The connection between the control unit 10 and the proximity sensors 26, 30 may be wire-based or wireless.

A configuration of the control unit 10 and the proximity sensors 26, 30 that are arranged at locations close to the vehicle tailgate is similar to those known in the art, for instance from international application WO 2012/084111 A1 mentioned in the introductory part of this application, and shall therefore not be described in more detail herein.

The sensor signal evaluation unit 18 is equipped with a processor unit 20 and a digital data memory 22, and is configured for evaluating the sensor signals 28, 32 received by the two capacitive proximity sensors 26, 30. To this end, the sensor signal evaluation unit 18 includes a software module 24 for carrying out a method of operating a sensor system formed by the two capacitive proximity sensors 26, 30 with regard to generating a trigger signal 40 indicative of an occurrence of an event in the presence of noise. The event is formed by an operator-intended event, in particular a kick motion of an operator's foot close to the vehicle tailgate. The trigger signal 40 is designed as an input to the processor unit 12 of the control unit 10. The method steps to be conducted are converted into a program code of the software module 24, wherein the program code is implemented in the digital data memory 22 of the sensor signal evaluation unit 18 and is executed by the processor unit 12 of the sensor signal evaluation unit 18.

Figure 4:
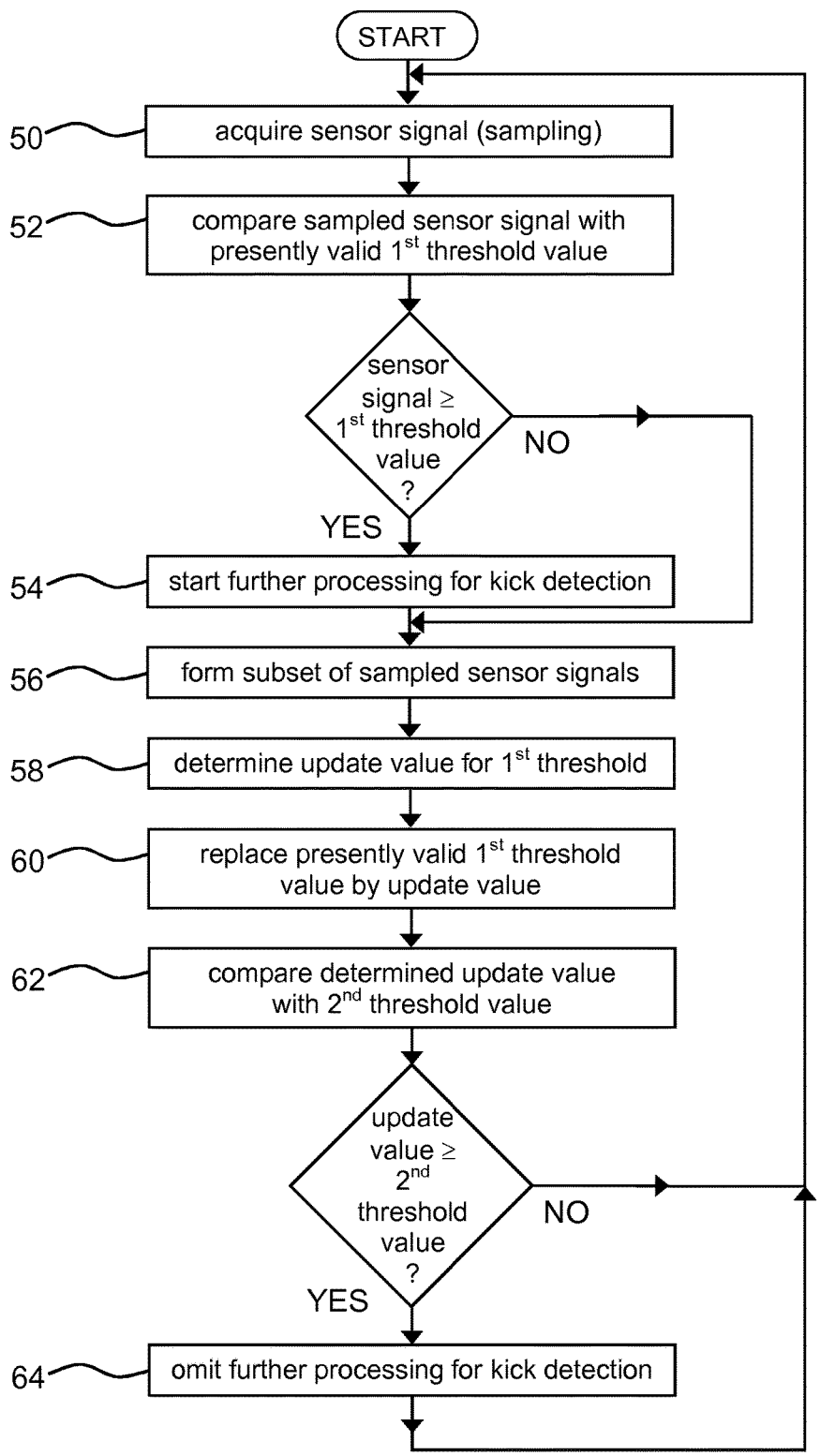
FIG. 4 is the flow scheme of the method in accordance with the invention.

In the following, an embodiment of the method will be described. A flowchart of the method is illustrated in FIG. 4. In preparation of operating the control unit 10 and the two capacitive proximity sensors 26, 30, it shall be understood that all involved units and devices are in operational state and configured as illustrated in FIG. 1. Magnitudes of the signals 28, 32 of the proximity sensors 26, 30 are being monitored by the sensor signal evaluation unit 18. Execution of the method steps is started if the magnitude of one of the signals 28, 32 of the capacitive proximity sensors 26, 30 exceeds an activation threshold. After that, the method steps are automatically repeated until the magnitudes of the signals 28, 32 of the proximity sensors 26, 30 fall below the activation threshold.

Figure 2:
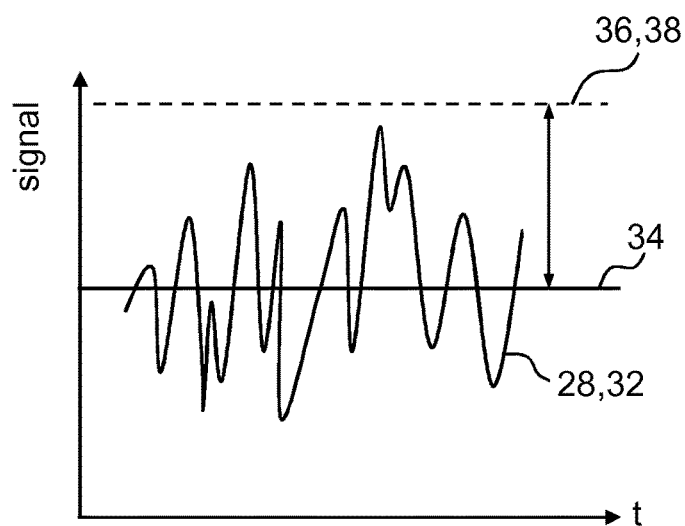
FIG. 2 schematically illustrates a sensor signal generated by a proximity sensor.

FIG. 2 schematically illustrates a typical sensor signal 28, 32 generated by the capacitive proximity sensors 26, 30 over time. A magnitude of the sensor signals 28, 32 and any threshold values 36, 38 are referenced against a corresponding baseline 34 which can be considered as a signal level resulting from applying low pass filtering to the sensor signal 28, 32. A cut-off frequency of the low pass filter may e.g. be ⅒ of an expected lowest frequency of a wanted signal. For a kick motion of the operator, the expected lowest frequency can be estimated as 0.5 Hz, so that the cut-off frequency of the low pass filter may be selected to be 0.05 Hz or even lower.

Although only described for one of the capacitive proximity sensors 26, 30 in the following, the disclosed method steps are understood to be applied to each one of the two capacitive proximity sensors 26, 30.

In a first step 50 of the method, the sensor signal 28, 32 is acquired at specified sampling times, i.e. with a constant sampling rate, and the acquired sensor signal 28, 32 is digitally converted for further signal processing.

In a next step 52 of the method, a value obtained as a presently sampled sensor signal 28, 32 (denoted in FIG. 3 by the letter k) is compared with a presently valid first threshold value 36 that is stored in the digital data memory 22 of the sensor signal evaluation unit 18.

If the value obtained as the presently sampled sensor signal 28, 32 is as large as or exceeds the presently valid first threshold value 36, a trigger signal 40 is generated by the sensor signal evaluation 18 unit as a next step 54. If the value obtained as the presently sampled sensor signal 28, 32 is less than the presently valid first threshold value 36, the generation of the trigger signal 40 is omitted.

Figure 3:
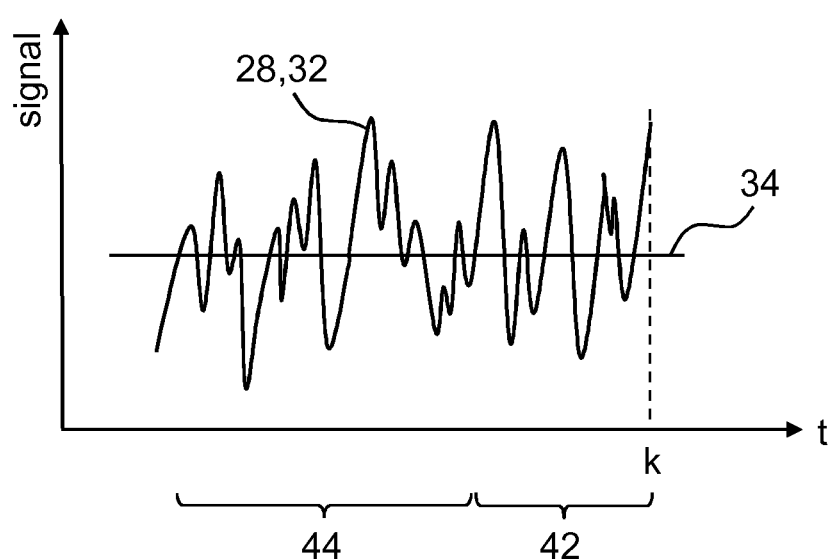
FIG. 3 schematically illustrates a result of forming a subset out of a sampled sensor signal as a step of a method in accordance with the invention.

Referring to FIG. 3, in the following step 56 of the method a subset 44 is formed out of the sampled sensor signals 28, 32. A predetermined number of consecutively acquired sensor signals 42 immediately preceding the presently sampled sensor signal 28, 32 is excluded from forming the subset 44.

Based on the formed subset 44 of sampled sensor signals 28, 32, an update value for the first threshold value 36 is determined in a next step 58. In this step 58, a statistical measure that is indicative of a volatility of the values of at least the formed subset 44 of sampled sensor signals 28, 32, namely the standard deviation, is calculated. Algorithms for conveniently calculating the standard deviation of sampled data without the need of storing the sampled data are known from literature, for example from Donald E. Knuth: "*The Art of Computer Programming*". The step 58 of determining an update value for the first threshold value 36 is based on the calculated statistical measure inasmuch as the calculated standard deviation is multiplied by a predetermined constant factor, which can be a value between 3 to 6 depending on the desired sensitivity and/or noise filtering. The factor may e.g. have a value of 4.0. Further, the calculated product is compared with a predetermined lower bound value which is depending on the electronic configuration, e.g. a value of 5.0. Both the predetermined constant factor and the predetermined lower bound value are stored in the digital data memory 22 of the sensor signal evaluation unit 18. The update value for the first threshold value 36 is determined as the maximum of the calculated product and the predetermined lower bound value. As will be obvious to those skilled in the art, the standard deviation is a dimensioned quantity. For improved readability, all quantities are expressed in arbitrary units herein.

In a next step 60 of the method, the presently valid first threshold value 36 is replaced by the update value for the first threshold value 36 as a new presently valid first threshold value 36.

Then, in another step 62, the determined update value for the first threshold value 36 is compared with a predetermined second threshold value 38 that is stored in the digital data memory 22 of the sensor signal evaluation unit 18. If the determined update value for the first threshold value 36 is equal to or larger than the predetermined second threshold value 38, the signal evaluation unit 18 may determine that the level of noise exceeds a level that is beyond a regime for reliable operation, and the generation of the trigger signal 40 is omitted as a next step 64.

The disclosed steps are repeated synchronously with the specified sampling of sensor signals 28, 32.

In an alternative method in accordance with an embodiment of the invention, in the step 58 of determining an update value for the first threshold value 36 on the basis of the formed subset 44 of sampled sensor signals 28, 32, an update value is determined by calculating a difference of the presently valid first threshold value 36 and the presently sampled sensor signal 28, 32, comparing the calculated difference with a predetermined distance value, calculating the update value for the first threshold value 36 as the sum of the presently sampled sensor signal 28, 32 and the predetermined distance value, if the calculated difference is less than the predetermined distance value, calculating the update value for the first threshold value 36 as the sum of a maximum taken among a predetermined number of samples acquired before the presently sampled sensor signal 28, 32 and the predetermined distance value, if the calculated difference is larger than the predetermined distance value, comparing the calculated update value for the first threshold value 36 with a predetermined lower bound value, and determining an update value for the first threshold value 36 as the maximum of the calculated update value and the predetermined lower bound value.

This may for instance be accomplished by executing the following exemplary code:

```
maxIncrease=5;
minDist=1;
L=5;
H min=L; (for first sample; k=1) preliminary
s=signal(k)
if baseLine (k) + H min(k-1) - s< minDist
    H min (k) = min(s+baseLine(k)+minDist , maxIncrease:)
else if h__min has not been updated within last 20 samples
    H min (k)= max(x(s)-baseLine(s); s=t-20 ,..., t)+minDist
end
H min(k)= max(H min(k), L)
``` wherein H min(k) denotes the update value for the first threshold value, determined for a current sample of the proximity sensor signals, signal(k) denotes the presently sampled sensor signal 28, 32, L denotes the predetermined lower bound value, minDist denotes the predetermined distance value, and baseLine denotes the signal baseline 34.

In a second alternative method in accordance with an embodiment of the invention, in the step 58 of determining an update value for the first threshold value 36 on the basis of the formed subset 44 of sampled sensor signals 28, 32, an update value is determined by
  calculating a plurality of discrete Fourier coefficients for at least the formed subset 44 out of the sampled sensor signals 28, 32,
  determining a highest absolute value among the calculated plurality of Fourier coefficients,
  determining the update value for the first threshold value 36 as the lesser of the determined highest absolute value and a predetermined lower bound value.

Figure 5:
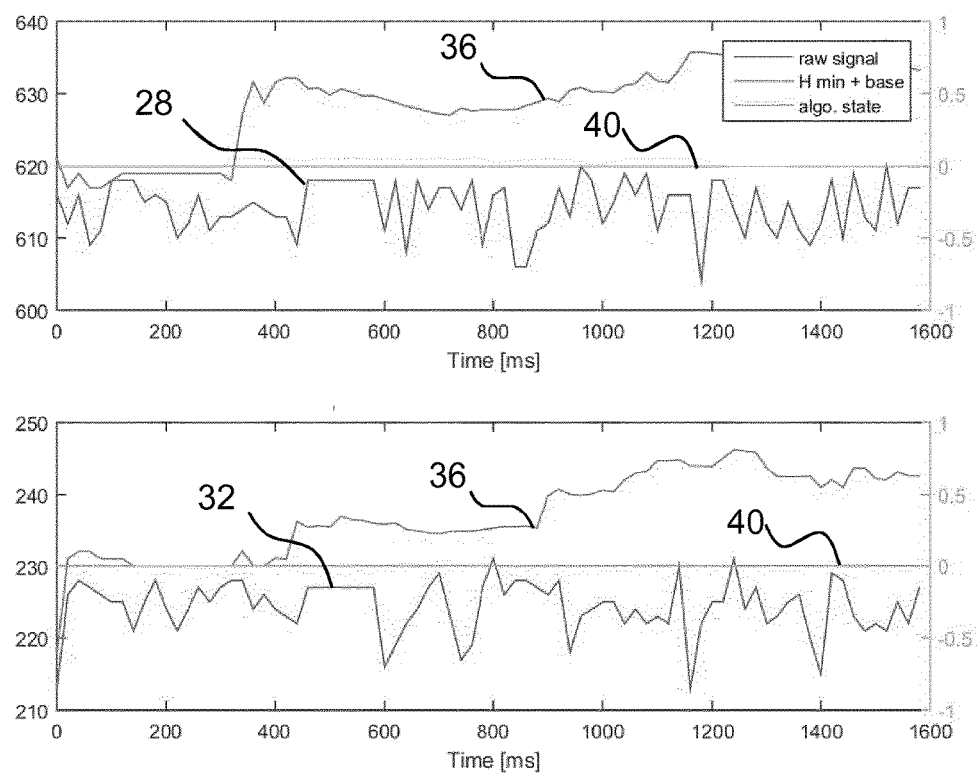
FIG. 5 shows time diagrams of proximity sensor signals, a presently valid first threshold value and a status of a trigger signal to the control unit pursuant to FIG. 1 obtained during execution of a method in accordance with the invention in a situation in which no activation is triggered.

FIG. 5 shows time diagrams of the proximity sensor signals 28, 32, the presently valid first threshold value 36 and a status of the trigger signal 40 of the sensor signal evaluation unit 18 to the processor unit 12 of the control unit 10 in a situation in which no activation is triggered. The time diagram shows how the first threshold value 36 adapts to increasing noise. During the entire time window represented in FIG. 5, the raw sensor signals 28, 32 stay clearly below the first threshold value 36 and accordingly no activation signal is triggered.

Figure 6:
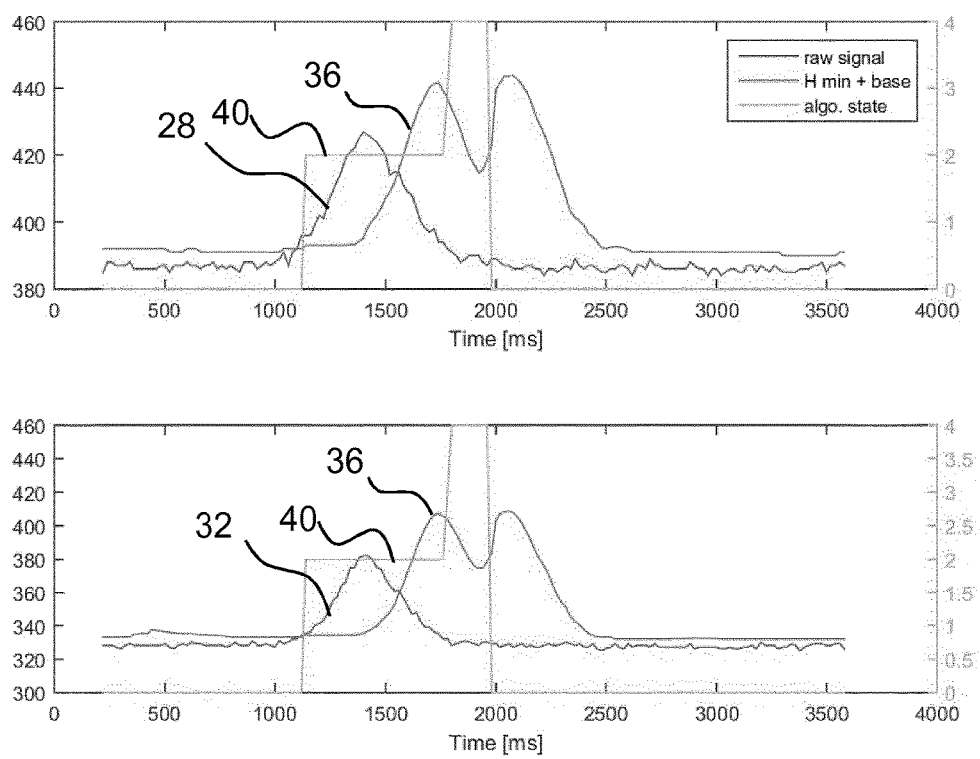
FIG. 6 shows time diagrams of proximity sensor signals, a presently valid first threshold value and a status of a trigger signal to the control unit pursuant to FIG. 1 obtained during execution of a method in accordance with the invention in a situation, where a kick is detected and a trigger signal is generated.

FIG. 6 shows time diagrams of the proximity sensor signals 28, 32, the presently valid first threshold value 36 and a status of the trigger signal 40 of the sensor signal evaluation unit 18 to the processor unit 12 of the control unit 10 in a situation, where a kick is detected and a trigger signal is generated. This figure displays the behavior during a usual kick.

Around the time mark of 1100, the sensor signals 28, 32 of the respective sensors cross the respective value of the first threshold value 36 and a trigger signal 40 is generated by the sensor signal evaluation unit 18 and provided to the processor unit 12 of the control unit 10, which, upon receiving the trigger signal 40, commences to carry out additional steps of the processing of kick detection. During the further processing of kick detection, the adaptive threshold 36 is still updated in the background but it is not considered during kick processing.

While an embodiment of the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A method of operating a sensor system with regard to generating a trigger signal indicative of an occurrence of an operator-actuated event in the presence of noise, the sensor system including at least one proximity sensor that generates a sensor signal indicative of a sensed physical quantity and a control unit having an evaluation unit, the method comprising steps of:
  acquiring, via the evaluation unit, sample values of the sensor signal at a predetermined sampling interval,
  comparing, via the evaluation unit, a presently sampled value acquired as a presently sampled sensor signal with a first threshold value stored in a memory of the evaluation unit,
  generating, via the evaluation unit, the trigger signal for controlling a motor-driven vehicle door member when the value obtained as the presently sampled sensor signal is as large as or exceeds the first threshold value,
  omitting to generate, via the evaluation unit, the trigger signal when the value obtained as the presently sampled sensor signal is less than the first threshold value,
  forming, via the evaluation unit, a subset out of the sampled values of the sensor signals, wherein a predetermined number of consecutively acquired sensor signals immediately preceding the presently sampled value are excluded from forming the subset,
  based on the formed subset of sampled sensor signals, determining, via the evaluation unit, an update value for the first threshold value, and
  adapting the first threshold value to the presence of noise, via the evaluation unit, by setting the first threshold value stored in the memory of the evaluation unit equal to the update value.

2. The method as claimed in claim 1, wherein the step of acquiring, via the evaluation unit, the sensor signal at a predetermined sampling interval comprises digitally converting the acquired sensor signal.

3. The method as claimed in claim 1, wherein the step of determining, via the evaluation unit, an update value for the first threshold value comprises
  calculating a statistical measure that is indicative of a volatility of the values of at least the formed subset of sampled sensor signals,
  and wherein the step of determining, via the evaluation unit, an update value for the first threshold value is based on the calculated statistical measure.

4. The method as claimed in claim 3, wherein the step of determining, via the evaluation unit, an update value for the first threshold value comprises
  multiplying the calculated statistical measure by a predetermined constant factor,
  comparing a calculated product of the multiplication with a predetermined lower bound value, and
  determining an update value for the first threshold value as the maximum of the calculated product and the predetermined lower bound value.

5. The method as claimed in claim 1, wherein the step of determining, via the evaluation unit, an update value for the first threshold value comprises calculating a difference of the first threshold value and the presently sampled sensor signal, comparing the calculated difference with a predetermined distance value, calculating the update value for the first threshold value as the sum of the presently sampled sensor signal and the predetermined distance value, when the calculated difference is less than or equal to the predetermined distance value, calculating the update value for the first threshold value as the sum of a maximum taken among a predetermined number of samples acquired before the presently sampled sensor signal and the predetermined distance value, when the calculated difference is larger than the predetermined distance value.

6. The method as claimed in claim 5, wherein the step of determining, via the evaluation unit, an update value for the first threshold value further comprises comparing the calculated update value for the first threshold value with a predetermined lower bound value, and determining an update value for the first threshold value as the maximum of the calculated update value and the predetermined lower bound value.

7. The method as claimed in claim 1, wherein the step of determining, via the evaluation unit, an update value for the first threshold value comprises calculating a plurality of coefficients based on a set of decomposition vectors for at least the formed subset out of the sampled sensor signals, determining a highest absolute value among the calculated plurality of coefficients, determining the update value for the first threshold value as the lesser of the determined highest absolute value and a predetermined lower bound value.

8. The method as claimed in claim 1, further comprising steps of:

comparing, via the evaluation unit, the determined update value for the first threshold value with a predetermined second threshold value, and omitting to generate, via the evaluation unit, a trigger signal when the determined update value for the first threshold value is equal to or larger than the predetermined second threshold value.

9. A control unit for generating a trigger signal for controlling activation of a motor-driven vehicle door member, the control unit comprising:

at least one processor unit and at least one digital data memory unit, wherein the at least one processor unit has data access to the at least one digital data memory unit, a sensor driving unit that is electrically connectable to at least one proximity sensor that is configured to generate a sensor signal indicative of a distance to an object, for providing a driving voltage to the at least one proximity sensor, a sensor signal evaluation unit that is connectable to the at least one proximity sensor and is configured for receiving the sensor signal as a signal input indicative of an operator-actuated event, and is configured for evaluating the received sensor signal by:

sampling values of the sensor signal at a predetermined sampling interval, comparing a presently sampled value acquired as a presently sampled sensor signal with a threshold value stored in a memory of the sensor signal evaluation unit, generating the trigger signal when the value obtained as the presently sampled sensor signal is as large as or exceeds the threshold value, omitting to generate the trigger signal when the value obtained as the presently sampled sensor signal is less than the threshold value, forming a subset out of the sampled sensor signals, wherein a predetermined number of consecutively acquired sensor signals immediately preceding the presently sampled sensor signal are excluded from forming the subset, based on the formed subset of sampled sensor signals, determining an update value for the threshold value, and adapting the threshold value to the presence of noise by setting the threshold value stored in the memory of the evaluation unit equal to the update value, wherein the at least one processor unit is configured to generate an output signal upon and as long as the trigger signal is being received from the sensor signal evaluation unit, wherein the output signal controls the motor-driven vehicle door member based on predetermined sensor signal validation criteria.

10. A non-transitory digital data memory on which is stored a software module comprising computer-readable program code that is executable by a processor unit and configured to:

receive a sensor signal indicative of an operator actuated event from at least one proximity sensor;

sample the sensor signal at specified sampling times, compare a value obtained as a presently sampled sensor signal with a stored threshold value, generating a trigger signal controlling a motor-driven vehicle door member when the value obtained as the presently sampled sensor signal is as large as or exceeds the stored threshold value, omitting to generate the trigger signal if the value obtained as the presently sampled sensor signal is less than the stored threshold value, forming a subset out of the sampled sensor signals, wherein a predetermined number of consecutively acquired sensor signals immediately preceding the presently sampled sensor signal is excluded from forming the subset, based on the formed subset of sampled sensor signals, determining an update value for the stored threshold value, and adapting the threshold value to the presence of noise by setting the stored threshold value equal to the update value.

* * * * *